United States Patent [19]

Nashimoto et al.

[11] Patent Number: 5,759,265
[45] Date of Patent: Jun. 2, 1998

[54] ORIENTED FERROELECTRIC THIN-FILM ELEMENT AND MANUFACTURING METHOD THEREFOR

[75] Inventors: Keiichi Nashimoto; Atsushi Masuda, both of Kanagawa, Japan

[73] Assignee: Fuji Xerox Co., Ltd., Tokyo, Japan

[21] Appl. No.: 434,281

[22] Filed: May 3, 1995

Related U.S. Application Data

[62] Division of Ser. No. 250,702, May 27, 1994, Pat. No. 5,567,979.

[30] Foreign Application Priority Data

May 31, 1993 [JP] Japan ................................. 5-149871

[51] Int. Cl.$^6$ ............................ C30B 23/02; C30B 29/22
[52] U.S. Cl. ............................. 117/105; 117/94; 117/948; 117/945
[58] Field of Search ................................ 117/105, 94, 948, 117/945

[56] References Cited

U.S. PATENT DOCUMENTS

| | | |
|---|---|---|
| 5,308,462 | 5/1994 | Iijima et al. |
| 5,323,023 | 6/1994 | Fork . |
| 5,331,187 | 7/1994 | Ogawa . |
| 5,347,157 | 9/1994 | Hung et al. |
| 5,378,905 | 1/1995 | Nakamura . |
| 5,514,484 | 5/1996 | Nashimoto ............................ 117/948 |
| 5,576,879 | 11/1996 | Nashimoto ............................ 359/248 |

FOREIGN PATENT DOCUMENTS

| | | |
|---|---|---|
| 61-185808 | 8/1986 | Japan . |
| 4-5874 | 1/1992 | Japan . |

OTHER PUBLICATIONS

Rou et al. Microstructural Characterization of Epitaxial Bottom Electrodes, Buffered layers and Ferroelectric Thin Films, Mater. Res. Soc. Symp. Proc. (1992), 243, abstract only, 1992.

P. Tiwari et al., "Growth of ceramic thin films on SI(100) using an in situ laser deposition technique." Department of Materials Science and Engineering, North Carolina University, Mar. 11, 1991, pp. 8358–8362.

E.J. Tarsa et al., "Growth and characterization of (111) and (001) oriented MgO films on (001) GaAs," Materials Department, University of California, Dec. 14, 1992, pp. 3276–3283.

*Primary Examiner*—Robert Kunemund
*Attorney, Agent, or Firm*—Finnegan, Henderson, Farabow, Garrett & Dunner, L.L.P.

[57] ABSTRACT

A buffer layer having crystal orientation In a (111) face is formed on a semiconductor single-crystal (100) substrate and a ferroelectric thin film having crystal orientation in a (111) or (0001) face is then formed over the buffer layer. The buffer layer is preferably formed of MgO at a temperature ranging from 20° to 600° C. and at a rate ranging from 0.5 to 50 Å/sec. The thus formed ferroelectric thin film has its axes of polarization aligned in one direction. Using the oriented ferroelectric thin-film device, highly functional nonvolatile memories, capacitors or optical modulators can be fabricated on semiconductor substrates.

13 Claims, 3 Drawing Sheets

ORIENTED FERROELECTRIC THIN-FILM ELEMENT AND MANUFACTURING METHOD THEREFOR

This is a division of application Ser. No. 08/250,702, filed May 27, 1994, now U.S. Pat. No. 5,567,979.

BACKGROUND OF THE INVENTION

1. Field of the Invention

The present invention relates to a ferroelectric thin-film element having a buffer layer with a specified crystal orientation formed on a single-crystal semiconductor substrate. More particularly, the present invention relates to an oriented ferroelectric thin-film element that permits a nonvolatile memory, a capacitor or an optical modulator to be fabricated on a semiconductor substrate.

2. Description of the Related Art

Because of the versatile properties possessed by ferroelectrics such as ferroelectricity, piezoelectricity, pyroelectricity and electrooptic effects, oxide ferroelectric thin films have so far been held to have potential use in nonvolatile memories and in many other applications such as surface acoustic wave devices, infrared pyroelectric devices, optoacoustic devices and electrooptic devices. In some of these applications, it is necessary to reduce the optical loss that occurs in thin-film optical waveguide structures and it is also required to insure polarizing characteristics and electrooptic effects comparable to those of single crystals. To meet these requirements, the preparation of single-crystal thin films is essential. To this end, many attempts have been made to form epitaxial ferroelectric thin films of $BaTiO_3$, $PbTiO_3$, $Pb_{1-x}La_x(Zr_{1-y}Ti_y)_{i-x/4}O_3$ (PLZT), $LiNbO_3$, $KNbO_3$, $Bi_4Ti_3O_{12}$, etc. on oxide single-crystal substrates by suitable techniques such as Rf-magnetron sputtering, ion-beam sputtering, laser ablation and metal organic chemical vapor deposition (MOCVD).

However, to achieve integration with semiconductor devices, the ferroelectric thin film must be formed on a semiconductor substrate.

For the formation of ferroelectric thin films on semiconductor substrates, it has been proposed that buffer layers capable of epitaxial growth at low temperatures be provided on semiconductor substrates. For example, a buffer layer of $MgAl_2O_4$ (100) or MgO (100) is allowed to grow epitaxially on single-crystal Si (100) as a substrate and a ferroelectric compound is then allowed to grow epitaxially on the substrate, as disclosed in Unexamined Japanese Patent Publication Sho. 61-185808. However, this publication fails to teach or suggest the crystallographic relationship between Si (100) and MgO (100). A later study has shown that when (100) oriented MgO is formed on single-crystal Si (100), the MgO simply has a (100) face parallel to a (100) face in Si but its in-plane directions are random; in other words, it is oriented polycrystalline MgO [P. Tiwari et al.; J. Appl. Phys., 69, 8358 (1991)].

The present inventors previously proposed a method in which a MgO (100) buffer layer was allowed to grow epitaxially on a GaAs semiconductor (100) substrate and then overlaid with an epitaxial or oriented ferroelectric thin film in Japanese Patent Application No. Hei. 4-319229. In this case, the following crystallographic relationships hold as regards $BaTiO_3$ on GaAs: $BaTiO_3(001)//MgO(100)//GaAs(100)$; in-plane directions $BaTiO_3[010]//MgO[001]//GaAs[001]$.

Particularly, Ga-As materials are used in the active layer of a semiconductor laser, and which have to be (100) orientated crystal so as to be the material for the active layer of the semiconductor. A single crystal material such as Lithium niobate used for the optical waveguide have to be orientated as a (0001) single crystal and is integrated with the semiconductor laser using Ga-As materials into one assembly so as to resonate on the surface of the optical waveguide. However, it is impossible due to the difference of the orientation of their crystal surface.

The previous proposal, however, has had the following problem. The lattice constants of the ferroelectric thin film and the symmetry of the crystal lattice are close to those of a (100) face in the MgO buffer layer. Therefore, except in tetrahedral ferroelectrics having the axes of polarization in a [001] direction, it has been impossible to align the axes of polarization in one direction over the semiconductor (100) substrate. For example, the lattice constants and symmetry of the crystal lattice of an orthorhombic ferroelectric having the axes of polarization in a [111] direction and a hexagonal ferroelectric having the axes of polarization in a [0001] direction differ from those of a (100) face in MgO. Accordingly, an orthorhombic ferroelectric thin film having crystal orientation in a (111) face or a hexagonal ferroelectric thin film having (0001) orientation cannot be formed on the semiconductor (100) substrate.

SUMMARY OF THE INVENTION

The present invention has been accomplished under these circumstances and has an object to provide an oriented ferroelectric thin-film element including a semiconductor single-crystal (100) substrate that carries on it an oriented ferroelectric thin film with unindirectionally aligned axes of polarization and crystal orientation in a (111) or (0001) face. Another object of the invention is to provide an oriented ferroelectric thin-film device that permits highly functional nonvolatile memories, capacitors or optical modulators to be fabricated on semiconductor substrates.

The present inventors conducted intensive studies in order to attain these objects and established a method by which a (100) epitaxial or oriented MgO buffer layer or a MgO buffer having random in-plane directions crystal orientation in a (111) face could selectively be formed on a semiconductor single-crystal (100) substrate. As a result of their continued studies, the inventors found that when a MgO buffer layer having random in-plane directions but crystal orientation in a (100) face was formed on the semiconductor single-crystal (100) substrate, an orthorhombic ferroelectric thin film having the axes of polarization in a [111] direction could be grown over the MgO buffer layer in (111) orientation whereas a hexagonal ferroelectric thin film having the axes of polarization in a [0001] direction could be grown over the MgO buffer layer in (0001) orientation. The present invention has been accomplished on the basis of this finding.

An oriented ferroelectric thin-film element of the present invention includes a semiconductor single-crystal (100) substrate, a buffer layer having a crystal orientation in a (100) face which is provided on the semiconductor single-crystal substrate, a ferroelectric thin film having a crystal orientation in one of (111) and (0001) faces which is provided on the buffer layer.

BRIEF DESCRIPTION OF THE DRAWINGS

In the accompany drawings.

DETAILED DESCRIPTION OF THE PREFERRED EMBODIMENTS

Figure 1:
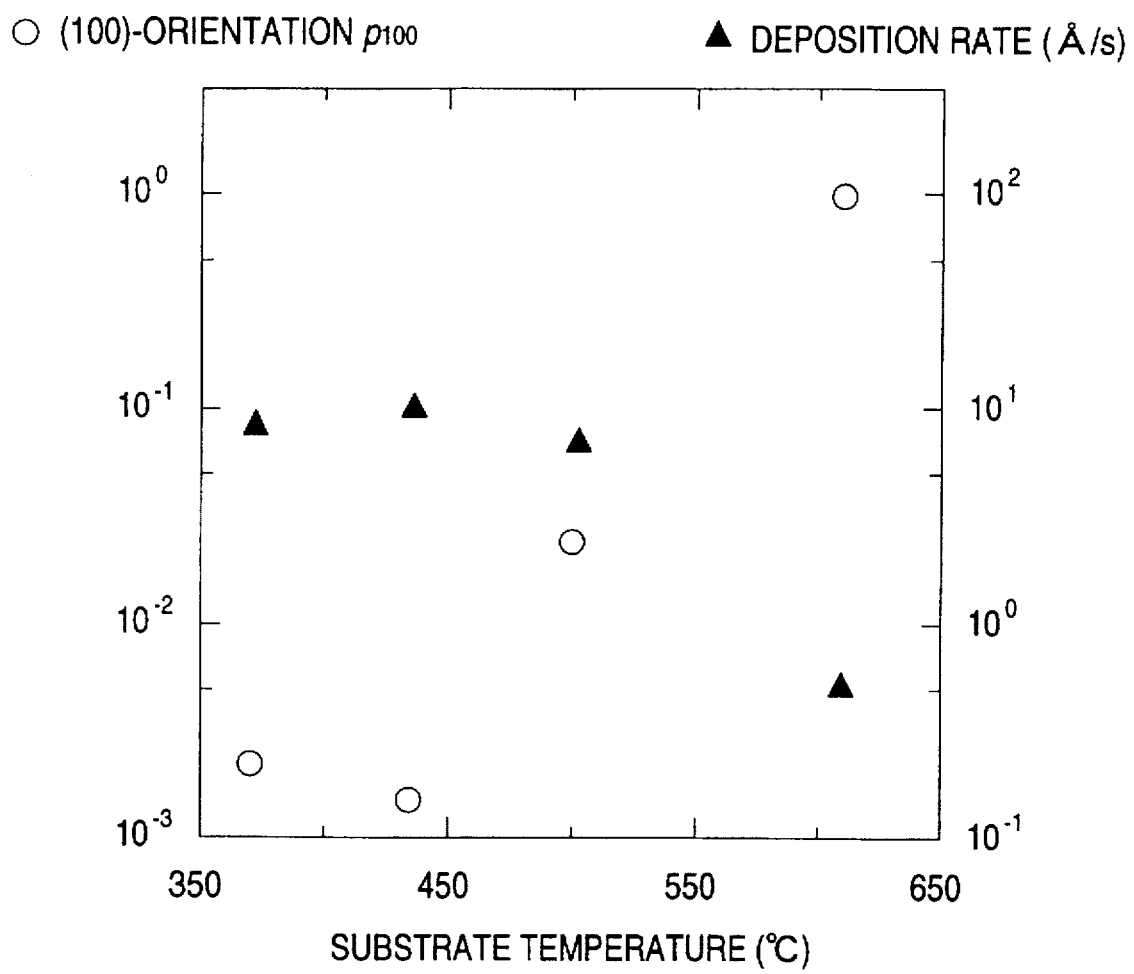
FIG. 1 is a diagram showing a (100)-orientation parameter and deposition rate of MgO thin films on Si(100) at an electron-beam current of 20 mA and $d_{ST}$ of 13 cm.

The preferred embodiment of the present invention will be described referring with the accompany drawings.

The semiconductor single-crystal (100) substrate to be used in the present invention is selected from among elemental semiconductors Si, Ge and diamond, III–V element compound semiconductors AlAs, AlSb, AlP, GaAs, GaSb, InP, InAs, InSb, AlGaP, AlInP, AlGaAs, AlInAs, AlAsSb, GaInAs, GaInSb, GaAsSb and InAsSb, and II–VI compound semiconductors ZnS, ZnSe, ZnTe, CdSe, CdTe, HgSe, HgTe and CdS.

A buffer layer having random in-plane directions but crystal orientation in a (111) face is formed on one of the semiconductor single-crystal (100) substrates. This buffer layer can be formed of any suitable materials including MgO, MgAl$_2$O$_4$ and Y-stabilized ZrO$_2$ or the like. Among these, MgO is particularly preferred. Ferroelectrics generally have smaller refractive indices than semiconductors but the MgO buffer layer has an even smaller refractive index than ferroelectrics; therefore, the provision of the MgO buffer layer enables semiconductor laser light to be confined in a ferroelectric thin-film waveguide, making it possible to fabricate either an optical modulator on a GaAs semiconductor layer or an optical integrated circuit on a Si semiconductor integrated circuit. For the purposes of the present invention, the buffer layer is appropriate if it has a thickness in the range from 10 to 10$^5$ Å.

The buffer layer having random in-plane directions but crystal orientation in a (111) face is overlaid with a ferroelectric thin film having crystal orientation in either a (111) or a (0001) face.

Preferred ferroelectrics are ABO$_3$-type oxide ferroelectrics, as respected by BaTiO$_3$, PbTiO$_3$, Pb$_{1-x}$La$_x$(Zr$_{1-y}$Ti$_y$)$_{1-x/4}$O$_3$ (PZT, PLT and PLZT), Pb(Mg$_{1/3}$Nb$_{2/3}$)O$_3$, KNbO$_3$, LiNbO$_3$, LiTaO$_3$, etc., and substituted derivatives thereof. For the purpose of the present invention, the ferroelectric thin film having crystal orientation in either a (111) or a (0001) face is appropriate if it has a thickness in the range from 10$^2$ to 10$^5$ Å.

In accordance with the invention, an orthorhombic ABO$_3$-type oxide ferroelectric thin film or the like that the axes of polarization in a [111] direction is grown in (111) orientation over the buffer layer having random in-plane directions but crystal orientation in a (111) face whereas a hexagonal ABO$_3$-type oxide ferroelectric thin film or the like that have the axes of polarization in a [0001] direction is grown in (0001) orientation over the same buffer layer, whereby the axes of polarization in these ferroelectrics can be aligned in one direction.

The buffer layer having random in-plane directions but crystal orientation in a (111) face is prepared by a vapor-phase growth technique as selected from among electron-beam evaporation, flash evaporation, ion plating, Rf magnetron sputtering, ion-beam sputtering, laser ablation, molecular beam epitaxy (MBE), chemical vapor deposition (CVD), plasma-assisted CVD, metal organic chemical vapor deposition (MOCVD), etc.

The buffer layer having crystal orientation in a (111) face is formed under the substrate temperature of 20° to 600° C., preferably 20° to 550° C., and the forming rate of 0.5 to 50 Å/sec, preferably, 1 to 10 Å/sec.

When forming the MgO layer, the orientation of MgO on the semiconductor (100) single-crystal substrate varies with the increasing film-forming rate and with the decreasing film-forming temperature. Stated more specifically, in response to the increase in the film-forming rate and to the decrease in the film-forming temperature, the MgO on the semiconductor (100) single-crystal substrate changes from an epitaxial film having single orientation in a (100) face to a film that has random in-plane directions but which is of single orientation in a (111) face. The exact reason for this phenomenon is not clear but a plausible explanation will be as follows. At film-forming rates slower than 0.1 Å/sec or at film-forming temperatures higher than 800° C., the molecules of MgO reaching the substrate surface migrate so actively that a two-dimensional superlattice forms at the MgO-GaAs interface due to the stable MgO:GaAs=4:3 lattice matching, increasing the chance of the formation of a low-energy (100) face. On the other hand, at high film-forming rates or low film-forming temperatures within the ranges specified above, the migration of the MgO molecules having reached the substrate surface is inhibited MgO that it becomes difficult for the MgO molecules to assume a stable energy state; further, MgO:GaAs=4:3 lattice matching is not possible at a (100) face in GaAs and, instead, there is high likelihood for the formation of a (111) face which has a lower density of atoms and a higher energy than the (100) face.

The ferroelectric thin film having crystal orientation in the (111) face or (0001) is preferably formed on the (111) orientated MgO layer by either a vapor-phase growth technique as selected from among electron beam evaporation, flash evaporation, ion plating, Rf-magnetron sputtering, ion beam sputtering, laser ablation, molecular beam epitaxy (MBE), chemical vapor deposition (CVD), plasma-assisted CVD and metal organic chemical vapor deposition (MOCVD) or a wet process such as the sol-gel method under the substrate temperature of more than 400° C., preferably, more than 500° C.

The following examples are provided for the purpose of further illustrating the present invention but are in no way to be taken as limiting.

EXAMPLE 1

Figure 3:
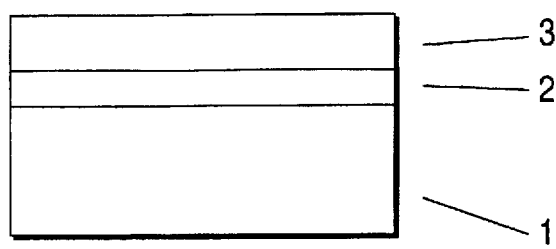
FIG. 3(a) and 3(b) are schematic side views of Example 1 and 2, respectively.
Figure 3:
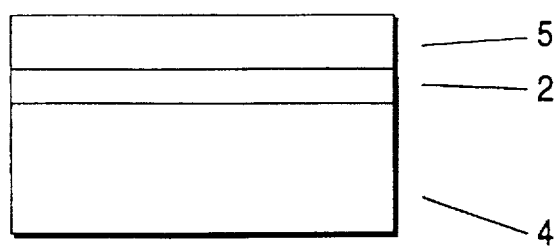

Example 1 will be described referring with FIG. 3(a).

A MgO layers 2 were formed on Si (100) single-crystal substrates 1 by the electron beam evaporation. The target was MgO which was positioned at a distance of 50 to 200 mm from each substrate and 5 to 20 mA of an electron beam current was permitted to flow. The Si single-crystal substrates 1 were heated with a halogen lamp to be held at temperatures of 300° to 700° C.

The Si single-crystal substrates 1 were 6×6 mm Si wafers of either n- or p-type having a (100) face. These Si single-crystal substrates 1 were cleaned with a solvent and etched with a HF solution. The etched substrates were spin-dried with ethanol in a nitrogen stream. Immediately after the spin drying, the Si single-crystal substrates 1 were introduced into a deposition chamber. After reaching the background pressure, the substrates 1 were heated so that the film formation of MgO were conducted at the time of achieving a predetermined substrate temperature.

MgO firms as the MgO layers 2 that were formed at a rate of 10.0 Å/sec and at temperatures of 370° C., 440° C. or 500° C., as well as the MgO film that was formed at a rate of 3.0 Å/sec and at a temperature of 440° C. were verified to have single orientation in a (111) face by X-ray diffraction analysis.

Immediately after the formation of MgO buffer layers 2 on the Si single-crystal substrates 1, PZT films 3 were formed on the MgO layers 2 by the sol-gel method. To prepare PZT film 3, Ti(O—i—C$_3$H$_7$)$_4$ and Zr(O—i—C$_3$H$_7$)$_4$ were dissolved at a specified molar ratio in 2-methoxyethanol:CH$_3$OCH$_2$CH$_2$OH (hereunder abbreviated as ROH); subsequently, Pb(CH$_3$COO)$_2$ was formulated in such a way that the molar ratio of Pb to (Zr+Ti) would be unity and then a solution was formed. Subsequently, the solution was distilled at 125° C. for a predetermined time, thereby forming a metal complex Pb(Zr,Ti)O$_2$(OR)$_2$ while, at the same, a by-product CH$_3$COOCH$_2$CH$_2$OCH$_3$ was removed. In the next step, a solution of H$_2$O:NH$_4$OH in ROH was added to the reaction solution in such a way that the ratio between Pb, H$_2$O and NH$_4$OH would be 1:1:0.1 and the mixture was refluxed for several hours to effect partial hydrolysis of the metal alkoxide. Thereafter, the solution was concentrated under vacuum to eventually yield a stable precursor solution having a Pb concentration of 0.6M. All the steps described above were conducted in a N$_2$ atmosphere.

The precursor solution was spin coated at 2,000 rpm on the MgO buffer layer 2 carrying Si(100) substrates 1 in a N$_2$ atmosphere at room temperature (20° C.). After the spin coating, the substrates were heated at 300° C. in an O$_2$ atmosphere and thereafter heated at 650° C. so as to crystallize the PZT film. As a result, obtained were thin PZT films 3 in a thickness of 1000 Å.

The orthorhombic PZT film (Zr:Ti=50:50) formed on the MgO layers having single orientation in a (111) face were also oriented in a (111) face and their axes of polarization [111] were oriented normal to the substrate surface.

EXAMPLE 2

Example 2 will be described referring with FIG. 3(b).

MgO buffer layers 2 were formed on GaAs substrates 4 by electron beam evaporation as in Example 1. The target was MgO which was positioned at a distance of 50 to 200 mm from each substrate and 5 to 20 mA of an electron beam current was permitted to flow. The GaAs substrates 4 were heated with a halogen lamp to be held at temperatures of 200° to 600° C.

The GaAs substrates 4 were 6×6 mm GaAs wafers of n-type that were oriented in (100)±0.2°. These GaAs substrates 4 were cleaned with a solvent and etched with a H$_2$SO$_4$ solution. The etched GaAs substrates 4 were rinsed with deionized water and ethanol, then spin dried with ethanol in a nitrogen stream. Immediately after the spin drying, the substrates 4 were introduced into a deposition chamber. After reaching the background pressure, the substrates 4 were heated so that the film formation of MgO were conducted at the time of achieving a predetermined substrate temperature.

MgO films as the MgO buffer layers 2 that were formed at a rate of 10.0 Å/sec and at 20° C., as well as at 200° C. were verified to have single orientation in a (111) face by X-ray diffraction analysis.

In the next step, LiNbO$_3$ was grown in situ on the Mgo layers 2 having single orientation in a (111) face. The LiNbO$_3$ films 5 formed at temperatures of 500° to 800° C. were hexagonal, exhibiting single orientation in a (0001) face and their axes of polarization [0001] were oriented normal to the substrate surface.

EXAMPLE 3

The substrate temperature dependency, forming film rate dependency and electron beam current dependency of the (100)-orientation parameter of MgO were estimated, when the buffer layer of MgO was formed on Si (100) substrate by the electron beam evaporation.

The Si single-crystal substrates were 6×6 mm Si wafers of either n-type having a (100) face. The Si wafers were in 6×6 mm of n-type. These Si wafers were cleaned with a solvent and etched with a Hydrofluoric acid solution. The etched Si substrates were rinsed with deionized water and ethanol, then spin dried with ethanol in a nitrogen stream. Immediately after the spin drying, the substrates were introduced into a deposition chamber. The distance between a target and the substrate was )y, and the substrate temperature and forming film rate were varied so that the (100)-orientation parameter of MgO were obtained by X-ray diffraction analysis. In this case, p(100) which was the (100)-orientation parameter of MgO was defined as the following equation;

$$P(100)=0.1\times I200/(0.1\times I200+I111)$$

where I200 and I111 are the diffraction intensities of the (200) plane and (111) plane; 0.1 is the relative intensity ratio of (111) to (200) according to the JCPDS file.

Figure 2:
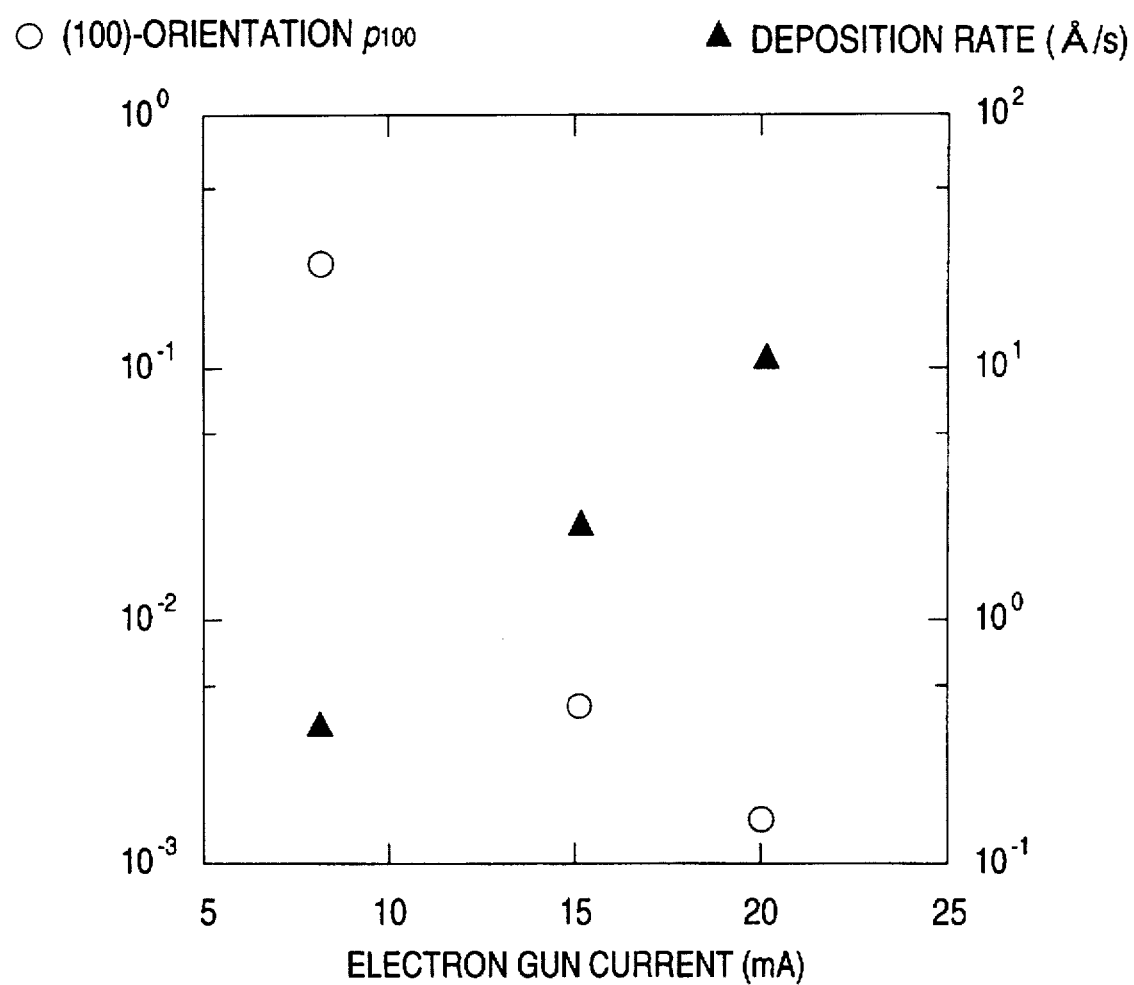
FIG. 2 is a diagram showing a (100)-orientation parameter and deposition rate of MgO thin films on Si(100) at an electron-beam current of 20 mA and $d_{ST}$ of 13 cm.

"O" marks in FIG. 1 show the (100)-orientation parameters in case of fixing the electron beam current in 20 mA. According to FIG. 1, the (100)-orientation parameter of MgO became high at the point of just excess 500° C., and then the orientation of MgO became completely (100) orientation at the point of just excess 600° C. On the other hand, in case of not exceeding 500° C., the orientation of MgO was (111) orientation. FIG. 2 shows results in case that the substrate temperature was fixed on 440° C. and the electron beam current was varied. The electron beam current is a parameter which is mainly relates to the forming film ratio. However, in accordance with the increment of the electron beam current and the forming film ratio of the substrate MgO film had a tendency to change from (100)-orientation to (111)-orientation.

Accordingly, in case of using a vapor-phase growth technique, suitable conditions for forming (111) buffer layers on (100) surface of the semiconductor a vapor-phase growth technique is that the substrate temperature is from 20° to 550° C., and the forming film ratio is 1 to 10 Å/sec.

In addition, the n-type Ga-As (100) single crystal substrate as used in Example 2 was conducted same estimations as mentioned above. In the result of the estimations, the similar tendency could be confirmed.

In the examples described above, the MgO buffer layers were formed by electron beam evaporation but this is not the sole film-forming process that can be used in the present invention; other vapor-phase growth techniques such as rf magnetron sputtering, ion beam sputtering, laser deposition, flash evaporation, ion plating, molecular beam epitaxy (MBE), ionized cluster beam epitaxy, chemical vapor deposition (CVD), metal organic chemical vapor deposition (MOCVD) and plasma-assisted CVD can also be used as effectively.

The ferroelectric thin-film device of the present invention has the MgO buffer layer of (111) orientation formed on the semiconductor single-crystal (100) substrate and, hence, the ferroelectric thin film that is formed over the buffer layer and which has (111) or (0001) crystal orientation has its axes of polarization aligned in one direction.

Because of this controllability over the orientation of the ferroelectric thin film, desirable properties such as large values of residual polarization and large electrooptic constants can be attained to insure that with FET devices having an insulator formed between a ferroelectric and a semiconductor, the injection of charges from the semiconductor into the polarized ferroelectric is effectively prevented to provide ease in maintaining the polarized state of the ferroelectric.

What is claimed is:

1. An oriented ferroelectric thin-film element manufacturing method comprising the steps of:
    providing a semiconductor single-crystal (100) substrate;
    forming a buffer layer having a crystal orientation of (111) and random in-plane directions, said buffer layer being provided on said semiconductor single-crystal substrate;
    forming a ferroelectric thin film having a crystal orientation in one of (111) and (0001) faces on said buffer layer.

2. An oriented ferroelectric thin-film element manufacturing method according to claim 1, wherein said semiconductor single-crystal (100) substrate comprises one of an elemental semiconductor and a compound semiconductor.

3. An oriented ferroelectric thin-film element manufacturing method according to claim 2, wherein said semiconductor single-crystal (100) substrate comprises one of elemental semiconductors Si, Ge and diamond, III–V element compound semiconductors AlAs, AlSb, AlP, GaAs, GaSb, InP, InAs, InSb, AlGaP, AlInP, AlGaAs, AlInAs, AlAsSb, GaInAs, GaInSb, GaAsSb and InAsSb, and II–VI compound semiconductors ZnS, ZnSe, ZnTe, CdSe, CdTe, HgSe, HgTe and CDS.

4. An oriented ferroelectric thin-film element manufacturing method according to claim 1, wherein said buffer layer comprises one of MgO, $MgAl_2O_4$ and Y-stabilized $ZrO_2$.

5. An oriented ferroelectric thin-film element manufacturing method according to claim 1, wherein said ferroelectric thin film comprises an $ABO_3$-type oxide.

6. An oriented ferroelectric thin-film element manufacturing method according to claim 5, wherein said $ABO_3$-type oxide is one of $BaTiO_3$, $PbTiO_3$, $Pb_{1-x}La_x(Zr_{1-y}Ti_y)_{1-x/4}O_3$(PZT, PLT and PLZT), $Pb(Mg_{1/3}Nb_{2/3})O_3$, $KNbO_3$, $LiNbO_3$, $LiTaO_3$, and substituted derivatives thereof.

7. An oriented ferroelectric thin-film element manufacturing method according to claim 1, wherein said buffer layer is formed at a temperature ranging from 20° to 600° C. and at a rate ranging from 0.5 to 50 Å/sec.

8. An oriented ferroelectric thin-film element manufacturing method according to claim 1, wherein said buffer layer is formed in a thickness of from 10 to $10^5$ Å.

9. An oriented ferroelectric thin-film element manufacturing method according to claim 1, wherein said ferroelectric thin film is formed in a thickness of from $10^2$ to $10^5$ Å.

10. An oriented ferroelectric thin-film element manufacturing method according to claim 1, wherein said buffer layer having crystal orientation in a (111) face and random in-plane directions is formed by a vapor-phase growth technique which is one of electron-beam evaporation, flash evaporation, ion plating, Rf magnetron sputtering, ion-beam sputtering, laser ablation, molecular beam epitaxy (MBE), chemical vapor deposition (CVD), plasma-assisted CVD, metal organic chemical vapor deposition (MOCVD).

11. An oriented ferroelectric thin-film element manufacturing method according to claim 1, wherein said buffer layer is formed under a substrate temperature of 20° to 600° C., and a forming rate of 0.5 to 50 Å/sec.

12. An oriented ferroelectric thin-film element manufacturing method according to claim 1, wherein said ferroelectric thin film is formed by one of a vapor-phase growth technique which is one of an electron beam evaporation, flash evaporation, ion plating , RF-magnetron sputtering, ion beam sputtering, laser ablation, molecular beam epitaxy (MBE), chemical vapor deposition (CVD), plasma-assisted CVD and metal organic chemical vapor deposition (MOCVD) and a sol-gel method.

13. An oriented ferroelectric thin-film element manufacturing method according to claim 1, wherein said ferroelectric thin film is formed on said buffer layer by one of a sputtering method, metal organic chemical vapor deposition (MOCVD), sol-gel method, laser vapor deposition and electron beam evaporation under the substrate temperature of more than 400° C.

* * * * *